United States Patent
Isoda et al.

(10) Patent No.: US 8,042,266 B2
(45) Date of Patent: Oct. 25, 2011

(54) MOUNTING APPARATUS AND METHOD TO CONTROL MOUNTING APPARATUS

(75) Inventors: Masashi Isoda, Hadano (JP); Hideki Takahashi, Hadano (JP)

(73) Assignee: Ricoh Company, Ltd., Tokyo (JP)

( * ) Notice: Subject to any disclaimer, the term of this patent is extended or adjusted under 35 U.S.C. 154(b) by 322 days.

(21) Appl. No.: 11/924,195

(22) Filed: Oct. 25, 2007

(65) Prior Publication Data

US 2008/0098591 A1    May 1, 2008

(30) Foreign Application Priority Data

Oct. 26, 2006  (JP) ................................ 2006-291743
Jul. 24, 2007  (JP) ................................ 2007-192569

(51) Int. Cl.
 *H05K 3/30* (2006.01)
 *B23P 19/00* (2006.01)
(52) U.S. Cl. .......................................... 29/832; 29/739
(58) Field of Classification Search .................. 29/832, 29/825, 834, 739, 740, 741
 See application file for complete search history.

(56) References Cited

U.S. PATENT DOCUMENTS

| | | | | |
|---|---|---|---|---|
| 4,862,578 A * | 9/1989 | Holcomb | ..................... | 29/564.1 |
| 5,930,140 A * | 7/1999 | Asai et al. | ..................... | 700/121 |
| 6,779,710 B2 * | 8/2004 | Igarashi et al. | ............ | 228/180.1 |
| 6,918,176 B2 * | 7/2005 | Nagao et al. | ..................... | 29/832 |
| 6,968,610 B2 | 11/2005 | Nagao et al. | | |
| 2003/0135991 A1 * | 7/2003 | Nagao et al. | ..................... | 29/739 |
| 2004/0025335 A1 * | 2/2004 | Soto | ............................... | 29/832 |
| 2005/0092782 A1 * | 5/2005 | Takahashi et al. | ............ | 222/504 |
| 2006/0000872 A1 * | 1/2006 | Nakagawa et al. | .......... | 228/56.5 |
| 2006/0207091 A1 * | 9/2006 | Takahashi | ....................... | 29/833 |
| 2008/0098591 A1 * | 5/2008 | Isoda et al. | ..................... | 29/740 |
| 2008/0217394 A1 * | 9/2008 | Okada et al. | .................. | 235/375 |

FOREIGN PATENT DOCUMENTS

CN      1438835 A     8/2003
JP      2004-6557     1/2004

* cited by examiner

*Primary Examiner* — David Angwin
(74) *Attorney, Agent, or Firm* — Oblon, Spivak, McClelland, Maier & Neustadt, L.L.P.

(57) ABSTRACT

A mounting apparatus to mount electronic components on a board includes at least one component feeder in which electronic components of different types are disposed in series, and a mounting information supplier which supplies mounting information. The component feeder is configured to mount the electronic components on the board based on the mounting information from the mounting information supplier.

8 Claims, 12 Drawing Sheets

| ELECTRONIC COMPONENT | | USED NUMBER | PACKING STYLE | | | | OCCUPATION NUMBER | EQUIPMENT SET No. |
| --- | --- | --- | --- | --- | --- | --- | --- | --- |
| COMPONENT No. | NAME | | MATERIAL | WIDTH (mm) | FEED (mm) | SYSTEM | | |
| 12345678F | 0.1MF Z 50V | 71 | PAPER | 8 | 4 | CASSETTE | 1 | 1-1 |
| 12345679F | 10kΩ J 1/10W | 52 | PAPER | 8 | 4 | CASSETTE | 1 | 1-2 |
| 12345670F | 1kΩ J 1/10W | 36 | PAPER | 8 | 4 | CASSETTE | 1 | 1-3 |
| 12345680F | 100kΩ J 1/10W | 24 | PAPER | 8 | 4 | CASSETTE | 1 | 1-4 |
| 12345681F | 3.3kΩ J 1/10W | 21 | PAPER | 8 | 4 | CASSETTE | 1 | 1-5 |
| : | : | : | : | : | : | : | : | : |
| 12345682F | 51kΩ F 1/8W | 1 | PAPER | 8 | 4 | CASSETTE | 1 | 1-38 |
| 12345683F | 15kΩ F 1/4W | 1 | PAPER | 8 | 4 | CASSETTE | 1 | 1-39 |
| 12345684F | 560Ω F 1/4W | 1 | PAPER | 8 | 4 | CASSETTE | 1 | 1-40 |
| 23456789G | 1AA234 | 24 | EMBOSSED | 8 | 4 | CASSETTE | 1 | 1-41 |
| 23456780G | ABC123D | 9 | EMBOSSED | 8 | 4 | CASSETTE | 1 | 1-42 |
| : | : | : | : | : | : | : | : | : |
| 12345685F | 820Ω J 1W | 1 | EMBOSSED | 12 | 4 | CASSETTE | 2 | 2-29 |
| 34567890Z | 1AB222 | 10 | EMBOSSED | 12 | 8 | CASSETTE | 2 | 2-31 |
| 34567891Z | 1CD333 | 2 | EMBOSSED | 12 | 8 | CASSETTE | 2 | 2-33 |
| 23456781G | 1EF444 | 1 | EMBOSSED | 12 | 8 | CASSETTE | 2 | 2-35 |
| : | : | : | : | : | : | : | : | : |

FIG. 2B

| | | | | | | |
|---|---|---|---|---|---|---|
| 987654321T | A1B-CD-EF2G-HJ | 1 | EMBOSSED | 24 | 12 | CASSETTE | 3 | 4-18 |
| 987654311T | A12B-CD-EF2G-HJ | 3 | EMBOSSED | 24 | 12 | CASSETTE | 3 | 4-21 |
| 234567820G | KLM:3NP456 | 1 | EMBOSSED | 24 | 12 | CASSETTE | 3 | 4-24 |
| 567890121L | QR7890S | 4 | EMBOSSED | 24 | 16 | CASSETTE | 3 | 4-27 |
| 123456866F | ABC12345D-6E7F890 | 1 | EMBOSSED | 24 | 16 | CASSETTE | 3 | 4-30 |
| 234567833G | 123GH J 45K | 2 | EMBOSSED | 24 | 16 | CASSETTE | 3 | 4-33 |
| 234567844G | LMN-6789-OP1 | 1 | EMBOSSED | 24 | 24 | CASSETTE | 3 | 4-36 |
| 987654300T | Q12R-ST-UV3W-XY | 2 | EMBOSSED | 32 | 12 | CASSETTE | 4 | 4-40 |
| 567890131L | ZA45678BC(11111) | 1 | EMBOSSED | 32 | 16 | CASSETTE | 4 | 4-44 |
| 567890144L | DEF7890GH-12 | 1 | EMBOSSED | 32 | 16 | CASSETTE | 4 | 5-1 |
| 567890155L | JKLM:3N:P45:6.7V:Q8 | 2 | EMBOSSED | 32 | 16 | CASSETTE | 4 | 5-5 |

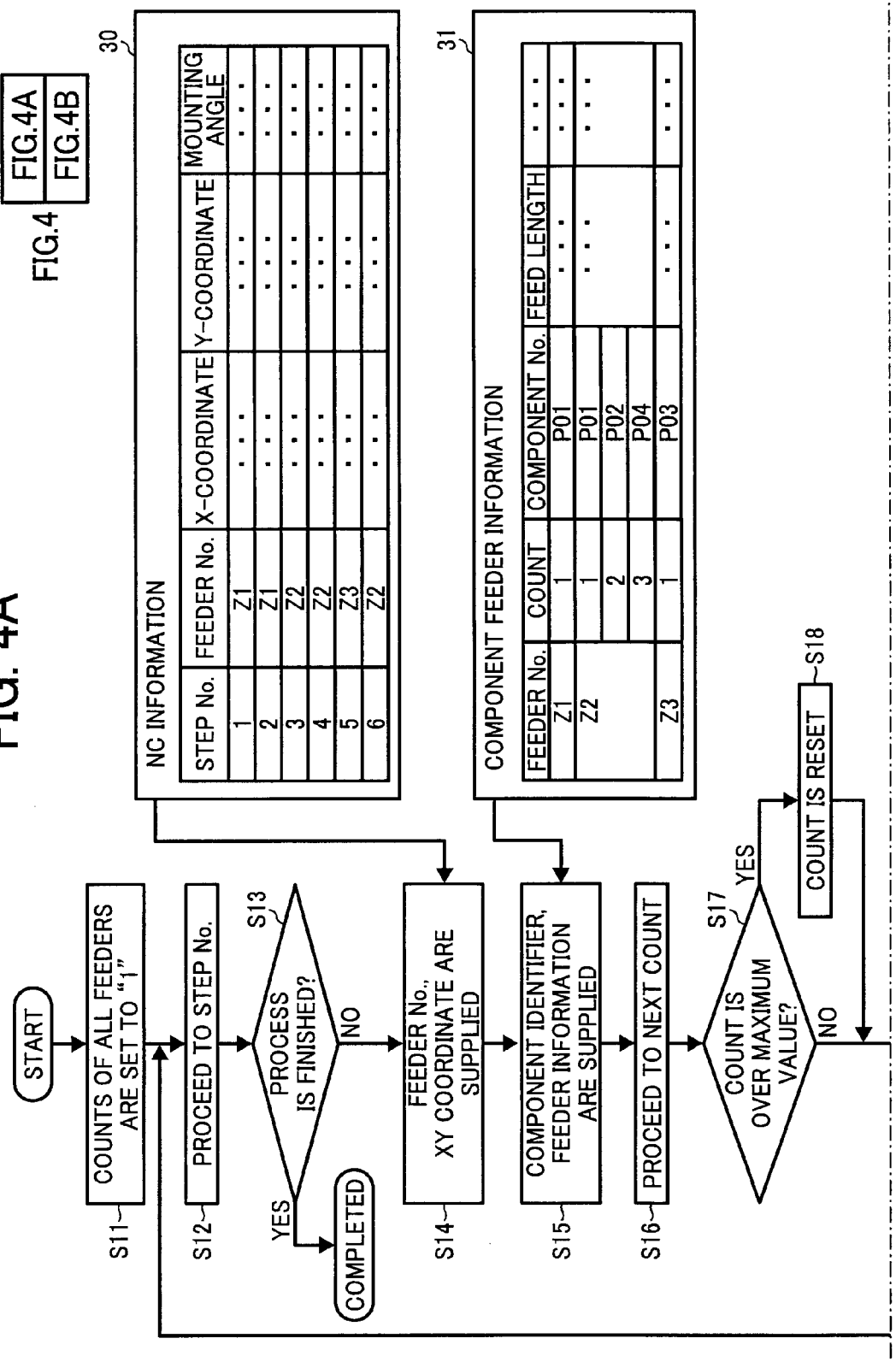

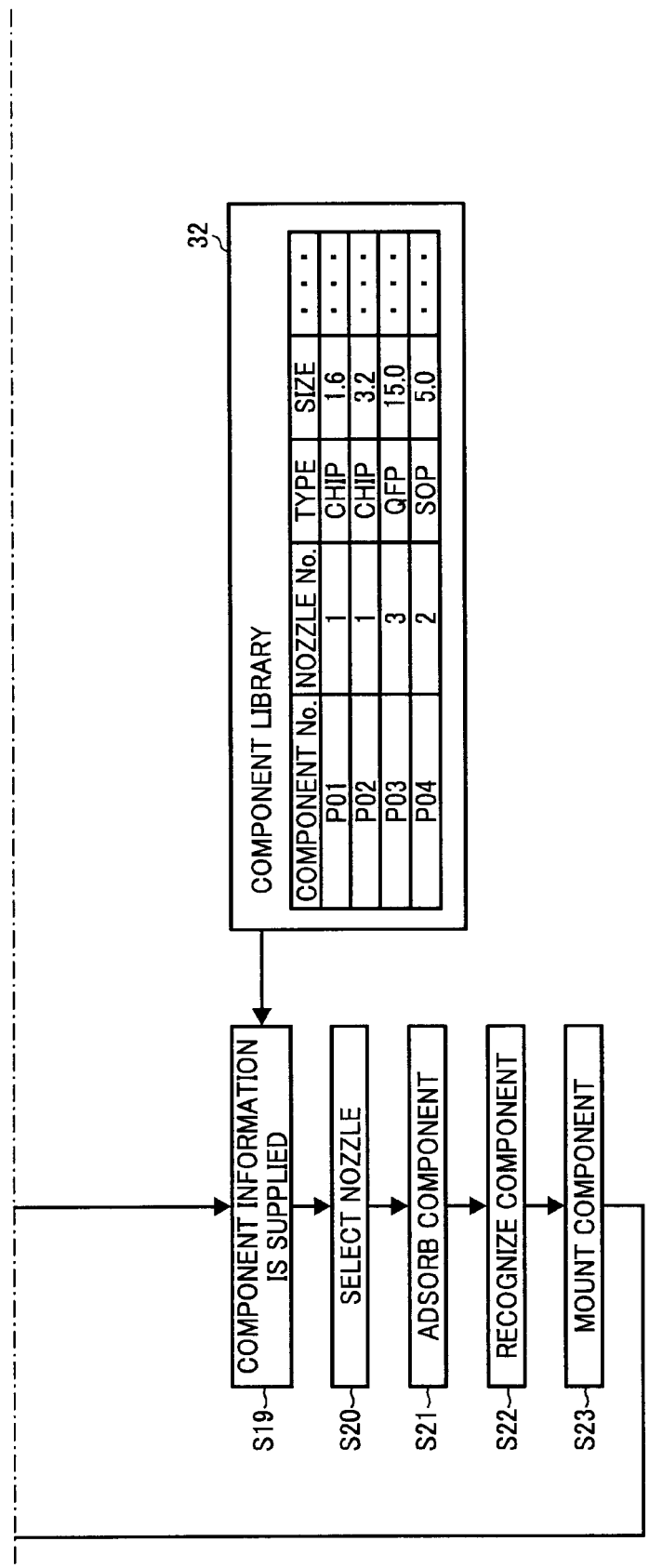

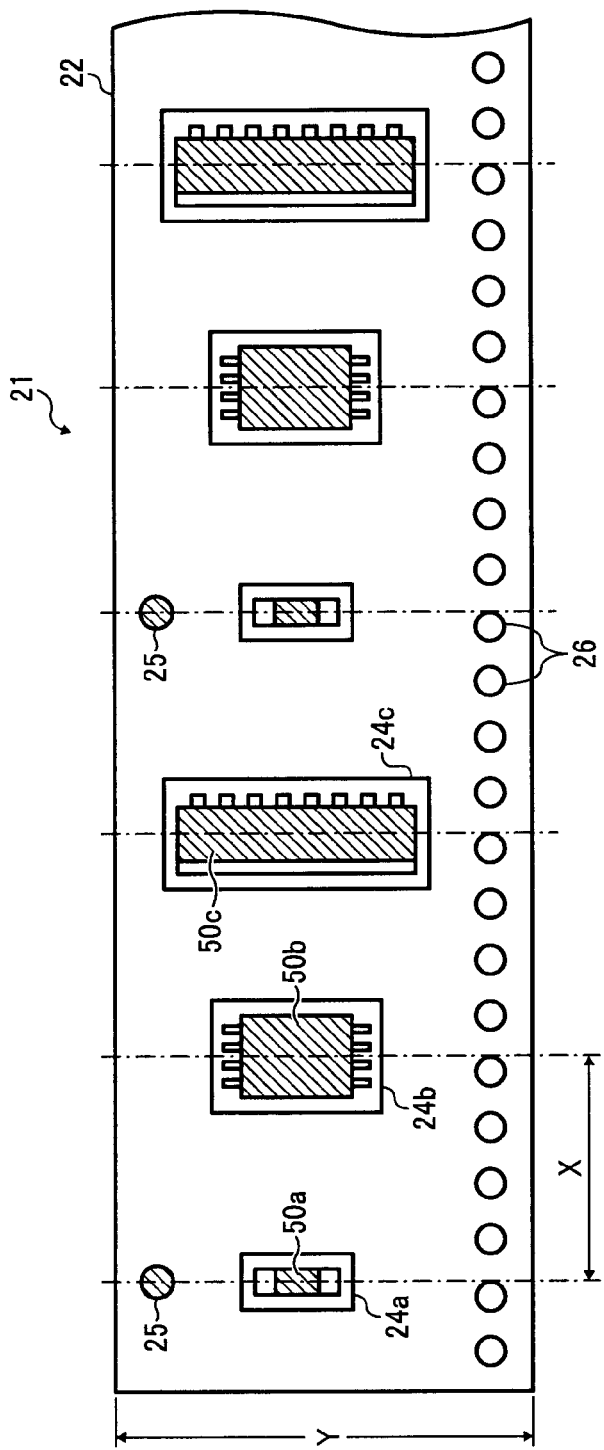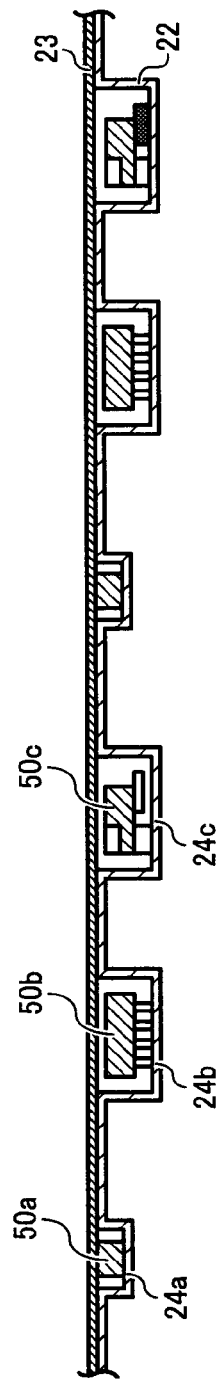

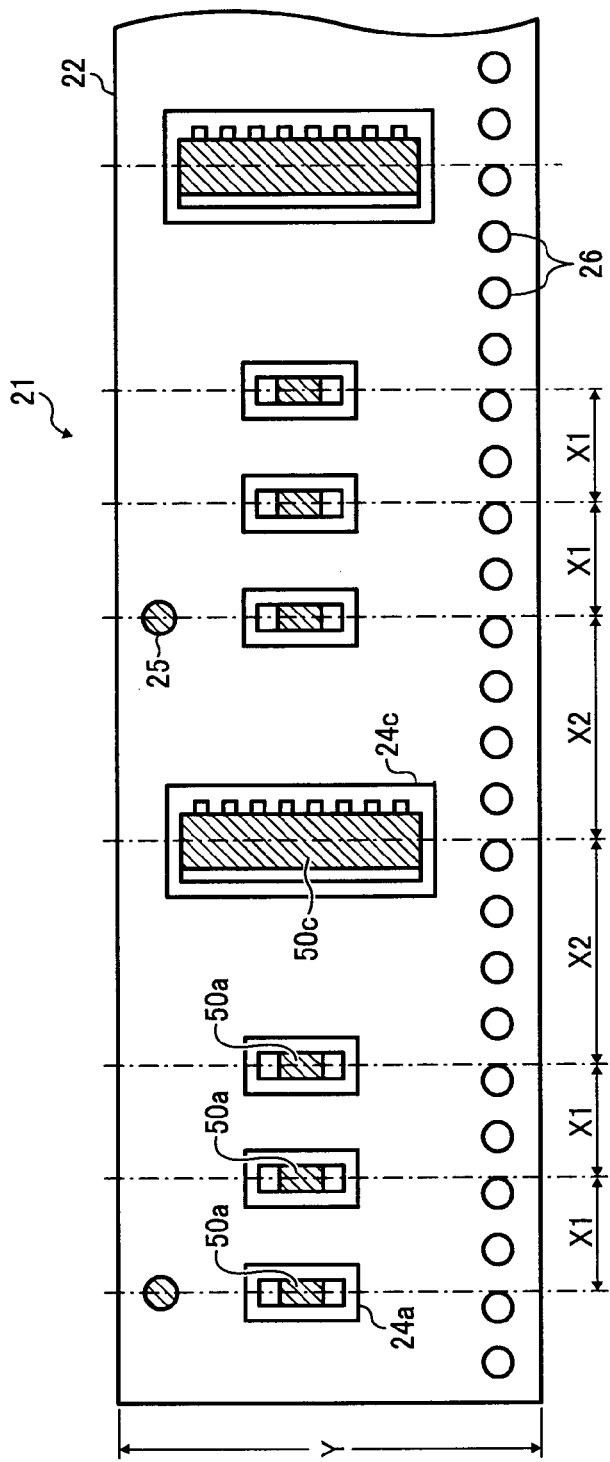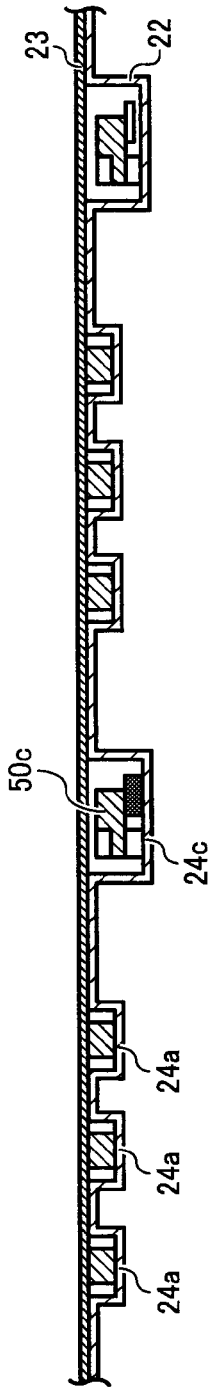

MOUNTING APPARATUS AND METHOD TO CONTROL MOUNTING APPARATUS

CROSS-REFERENCE TO THE RELATED APPLICATIONS

This application is based on and claims priority from Japanese Patent Application Nos. 2006-291743, filed on Oct. 26, 2006, and 2007-192569, filed on Jul. 24, 2007, the disclosure of which is incorporated herein by reference in its entirety.

BACKGROUND OF THE INVENTION

1. Field of the Invention

The present invention relates to a mounting apparatus to mount components on a board and a method to control the mounting apparatus. More particularly, the present invention relates to a mounting apparatus to mount electronic components such as a resistor, a capacitor, an IC, and the like on a printed wiring board, and a method to control the mounting apparatus.

2. Description of the Related Art

There are two types of mounting apparatuses used to mount electronic components on a printed wiring board, that is to say, one is a "robot type (X-Y robot)" and the other is a "rotary type". The robot type mounting apparatus has a movable head, which moves along X and Y axes which are at right angles to each other, and the movable head is provided with a plurality of adsorbing devices each of which adsorbs an electronic component to mount it on the printed wiring board. The adsorbing devices are disposed in a row along an X axial direction on the movable head. On the other hand, in the rotary type mounting apparatus, a holding portion such as a table of the mounting apparatus, which holds the printed wiring board, moves in the x, Y directions and a plurality of adsorbing devices, such as nozzles, each of which adsorbs an electronic component, are circularly disposed. Both types of the mounting apparatuses have a recognition device to recognize a posture of the adsorbed component.

The mounting apparatus has a component library in which component information such as a shape, a terminal number, and the like of each component is stored, a component feeder information database which identifies a component disposed on each component feeder, and an NC information database in which a component feeder identifier of each component feeder is stored in each step of mounting each component on the printed wiring board. In the NC information database, an X-Y coordinate, at which each of components is to be mounted on the printed wiring board, and the like, is also included.

FIG. 9 shows a flowchart of processes to control a conventional mounting apparatus.

In the mounting apparatus, at first, a step number (No.) is reset (S50), then a component feeder identifier corresponding to a component feeder, an X-Y coordinate of a printed wiring board, and a mounting angle with respect to each mounting step are obtained from the NC information database 60 (S51). Component feeder information corresponding to the obtained component feeder identifier and a component No. as a component identifier are obtained from the component feeder information database 61 (S52). Component information of the corresponding component is obtained from the component library 62 (S53). One adsorbing device is selected from the plurality of adsorbing devices with respect to the obtained component information (S54) and the movable head is moved based on the component feeder information and adsorbs the corresponding component (S55). After a posture, or the like, of the component is detected by use of the recognition device according to the component information (S56), the movable head is moved at the obtained X-Y coordinate and the component is mounted on the printed wiring board (S57). At this time, the first step is completed and then a process to mount all of the components proceeds to the next step No. (S58). It is judged whether or not the process is finished (S59). If the process is not finished ("No" in S59), the process returns to the step S51 and if the process is finished ("Yes" in S59), the process is completed.

On the other hand, Japanese Patent Application Publication No. 2004-6557 discloses an electronic component mounting apparatus in which a plurality of variant mounters capable of mounting single type-electronic components are connected to each other. The mounting apparatus has a control mechanism to switch a board feeding operation and a producing operation. In preparation for the producing operation, setup operations such as changing operations by use of trays or the like, editing operations of adsorbing positions, a changing operation of the NC information database, and the like, are required. In this mounting apparatus, the setup operations or maintenance operations of equipment can be performed during the board feeding operation.

However, in the conventional mounting apparatus illustrated in FIG. 9, carrier tapes on each of which only one type of component is disposed and which supply the components to the component feeder are used. Consequently, there is a problem in that a number of types of the components which can be handled by one component mounting apparatus is limited to a number of component feeders which are included in the one mounting apparatus.

Recently, the number of types and number of components disposed on a printed wiring board have increased with improvements in packaging density, and a plurality of mounters are required to be arranged in series (see Japanese Patent Application Publication No. 2004-6557).

The number of each of the components required in a board varies over in a large range depending on the component types. Therefore, one component feeder is required to be used even if the number of components of a single type is small.

SUMMARY OF THE INVENTION

An object of the present invention is to provide a mounting apparatus which uses at least one component feeder in which components of different types are disposed so that the number of component feeders used in the mounting apparatus can be reduced.

To achieve the above object, a mounting apparatus according to an embodiment of the present invention includes at least one component feeder in which electronic components of different types are disposed in series, and a mounting information supplier which supplies mounting information. The component feeder is configured to mount the electronic components on the board based on the mounting information from the mounting information supplier.

BRIEF DESCRIPTION OF THE DRAWINGS

FIG. 2 is a view showing an example of a library of a model to be produced.

FIG. 4 is a flowchart illustrating operations of a mounting apparatus according to a second embodiment of the present invention.

FIGS. 5A and 5B are views showing a structure of a taping member used in a mounting apparatus according to an embodiment of the present invention.

FIGS. 6A and 6B are views showing another structure of a taping member used in a mounting apparatus according to an embodiment of the present invention.

DETAILED DESCRIPTION OF THE PREFERRED EMBODIMENTS

Preferred embodiments of a mounting apparatus to mount components on a board and a method to control the mounting apparatus according to the present invention will be explained in detail with reference to the accompanying drawings below.

A mounting apparatus 100 according to an embodiment of the present invention includes at least one component feeder 300 in which electronic components of different types are disposed in series and a mounting information supplier 200 which supplies mounting information.

The component feeder is configured to mount the electronic components on the board based on the mounting information from the mounting information supplier.

Figure 1:
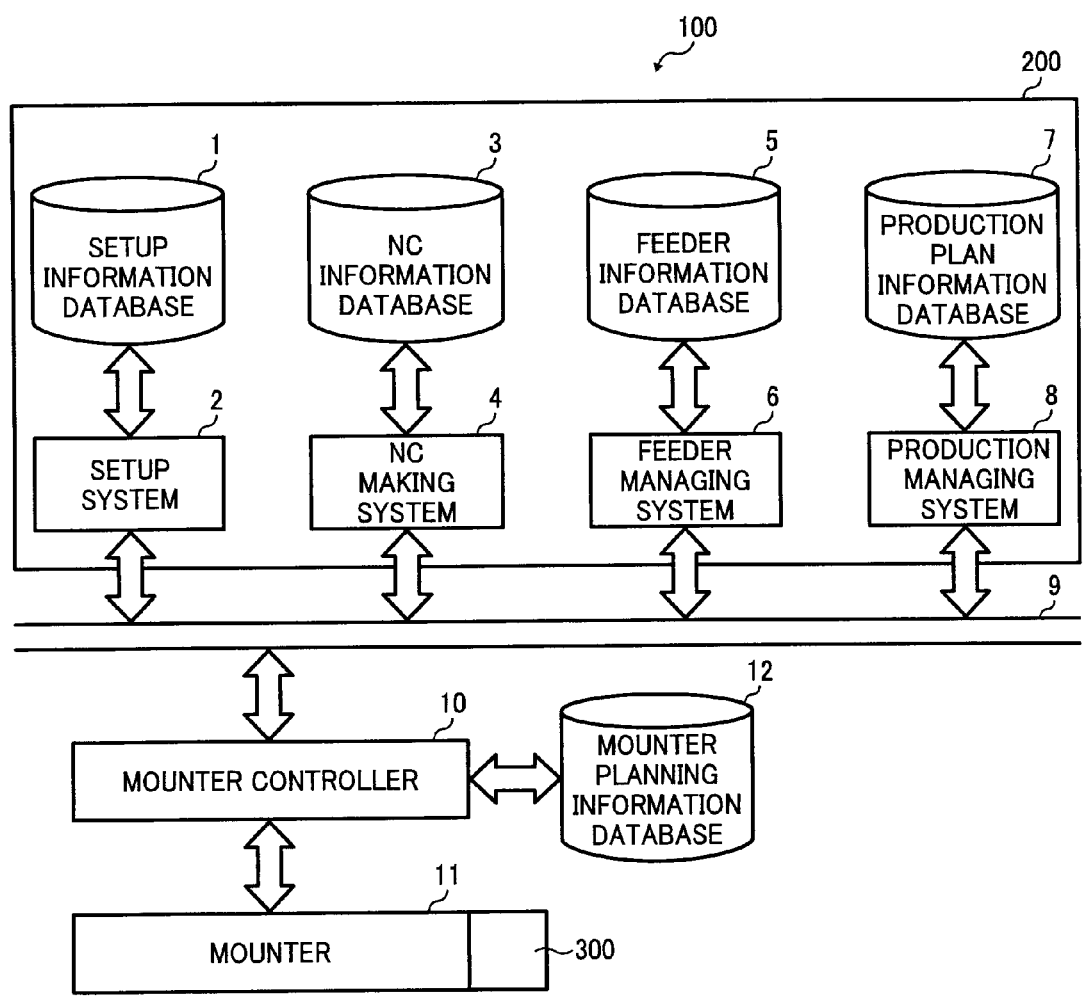
FIG. 1 is a block diagram showing a mounting apparatus according to an embodiment of the present invention.

FIG. 1 is a block diagram of the mounting apparatus 100 according to an embodiment of the present invention. In order to place any electronic components of any types on one component feeder, information such as shapes, number, or the like of the electronic components to be placed on the component feeder is required to be supplied so that a mounting process can proceed based on the information as needed.

Therefore, the mounting apparatus 100 shown in FIG. 1 has the mounting information supplier 200, which has a setup information database 1 as a component library section supplied through a setup system 2 on an information carrying line 9, an NC information database 3 as an NC information section supplied through an NC making system 4 on the information carrying line 9, and a component feeder information database 5 as a component feeder information section supplied through a component feeder managing system 6 on the information carrying line 9. The setup information database 1 includes component information such as components, the number of components to be used in a target model to be produced, and the like. The mounting information supplier also has a production plan information database 7 supplied through a production managing system 8 on the information carrying line 9. The mounting apparatus 100 also has a mounter controller 10, a mounter 11, and a mounter planning information database 12, and the like. The at least one component feeder which is connected to at least one carrier tape to allow electronic components to be fed is included in the mounter 11. The carrier tape acts to hold the electronic components and feed them to the component feeder.

The NC information database 3 supplies NC information such as a component feeder number and an X-Y coordinate of the printed wiring board, at which a component is to be mounted in each step. The component feeder information database 5 supplies the component feeder information in each component feeder. A component identifier of each component is also stored in the NC information database 3 or the component feeder information database 5. The setup information database 1 obtains the component identifier from the NC information database 3 or the component feeder information database 5 and then supplies a component library having component information including at least a nozzle number, a class of component, and a size of each component in each component identifier. The mounter 11 is connected to the at least one carrier tape in which the different types of electronic components are disposed in series. The mounter controller 10 controls the mounter 11 to mount the electronic components on the printed wiring board by identifying the component information in each mounting step.

FIG. 2 shows an example of a component library of a model to be produced by the mounting apparatus shown in FIG. 1. The component library as setup information shown in FIG. 2 is, for example, stored in the setup information database 1.

In the setup information shown in FIG. 2, a component number as the component identifier and a component name, of each component to be used in the printed wiring board are written in a component area 121. The number of components of each component type used in the printed wiring board is written in a used number area 122. Packing style information of each component such as the material of a tape, tape width, feed length value, system, or the like is written in a packing style area 125. An occupation number, which is the number of areas in the component feeder occupied with each electronic component, is written in a feeder occupation area 123.

The "occupation number" means a number of areas in each component feeder (slot) occupied with a chip feeder (electronic component feeding device) in which the electronic components are disposed. Generally, if an outer shape of the electronic component is relatively large, the tape in which the electronic component is placed has a relatively large width so that the size of the chip feeder is required to be relatively large. For example, if the occupation number is set to "1" when the tape width is 8 mm, the occupation number is "2", "3", and "4" when the tape width is 12, 24, 32 mm, respectively.

An equipment number of a mounting device on which the chip feeder is set and a component feeder number of the component feeder (slot) on which the chip feeder is set are written in an equipment set No. area 124. Therefore, in the example shown in FIG. 2, it is found that five mounting devices each of which is an equipment set are required when mounting the electronic components on the printed wiring board.

Figure 3:
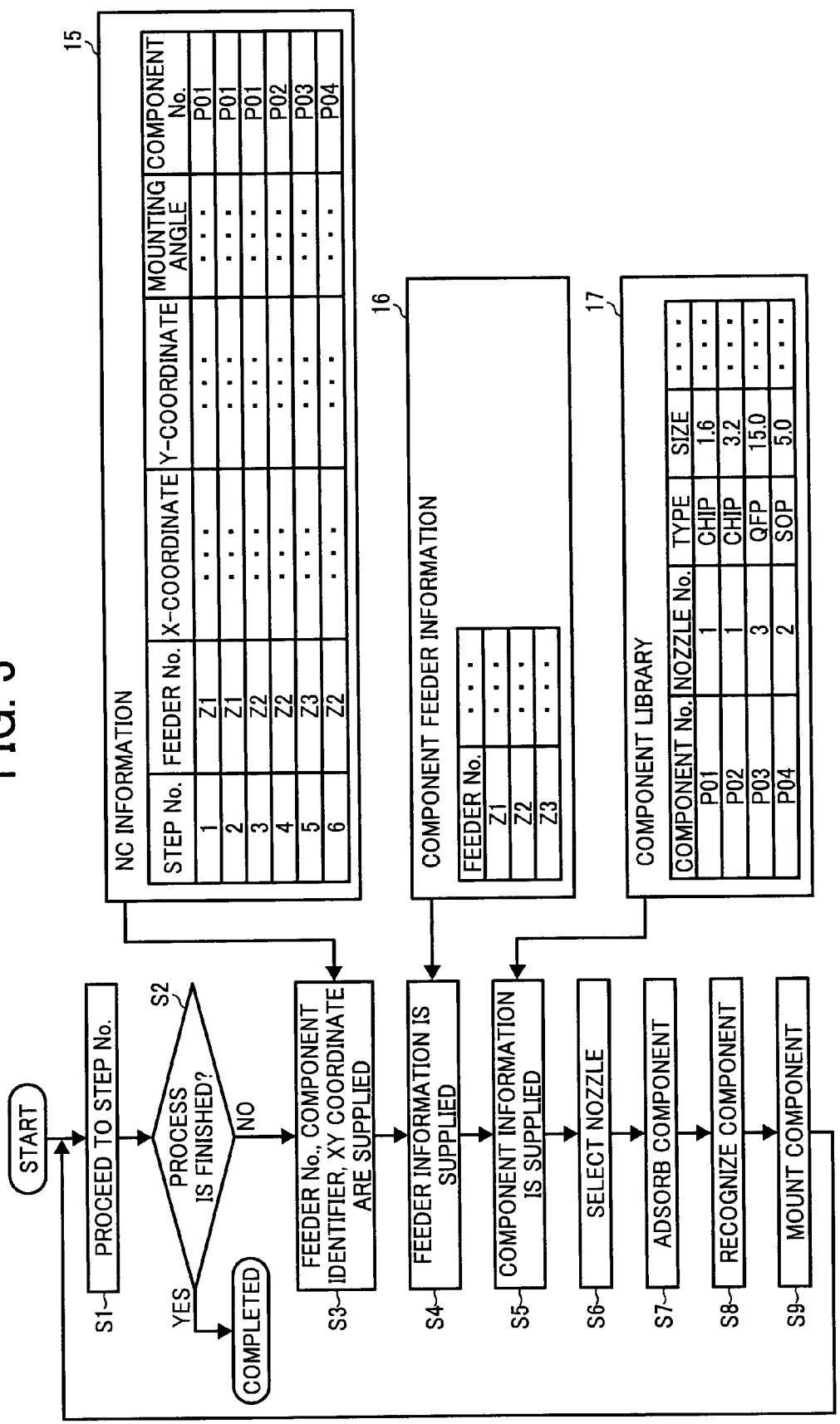
FIG. 3 is a flowchart illustrating operations of a mounting apparatus according to a first embodiment of the present invention.

FIG. 3 shows a flowchart illustrating operations of the mounting apparatus according to a first embodiment of the present invention. The following operations are performed mainly by the mounter controller 10.

In the mounting apparatus according to the first embodiment of the present invention, it is possible that one or more component identifiers be provided to a component feeder identifier (feeder No.). At this time, the mounting apparatus is required to be controlled as follows.

At first, a step No. is reset to specify a first step (S1). In step S2, it is judged whether or not the process to mount all of the components on the printed wiring board is finished. If the process is not finished ("No" in S2), the component feeder identifier, the component identifier, the X-Y coordinate of the printed wiring board, and a mounting angle are supplied with respect to each step from an NC information database 15 as the NC information section (S3).

Then, the component feeder information is supplied from a component feeder database 16 as the component feeder information section (S4). The component feeder information may include position correction information when the component is adsorbed, or the like.

According to the component identifier obtained in the step S5, the corresponding component information is supplied from a component library 17 as the component library section (S5). According to the obtained component information, an adsorbing device is selected from a plurality of adsorbing devices (S6). According to the component feeder information, a movable head is moved to adsorb the component (S7). After a posture or the like of the component is detected by use of the recognition device according to the component information (S8), the head is moved to the obtained X-Y coordinate to mount the component on the printed wiring board (S9). At this time, the process of the first step is finished and the process returns to the step S1. After the process proceeds to a next step No. in the step S1, if the process is not finished ("No" in S2), the process proceeds to the step S3, and if the process is finished ("Yes" in S2), the process is completed.

Since the mounting apparatus is controlled as described above, the component information of the component library can be selected even when the component is not on a one-to-one relationship with the component feeder, so that components of plural types can be mounted on the printed wiring board by one component feeder.

FIG. 4 shows a flowchart illustrating an operation of the mounting apparatus according to a second embodiment of the present invention.

In the mounting apparatus according to the second embodiment of the present invention, a list of component identifiers of the components disposed on the component feeder in series according to the disposed order in the component feeder can be provided in a component feeder information section 31 as shown in FIG. 4. At this time, the mounting apparatus is required to be controlled as follows.

At first, all counting identifiers in component feeders are set to "1" (S11), and the step No. is reset to specify a first step (S12). In step S13, it is judged whether or not the process is finished. If the process is not finished ("No" in S13), the component feeder identifier, the X-Y coordinate, and the mounting angle are supplied with respect to each step from an NC information database 30 as the NC information section (S14). The corresponding component feeder identifier and the corresponding component identifier are supplied from a component feeder information database 31 as the component feeder information section (S15). At this time, the component identifier is obtained based on the corresponding counting identifier in the component feeder. Then, a count of the counting identifier of the component feeder proceeds to the next count (S16).

Then, it is judged whether or not the count of the counting identifier is a maximum value (S17). If the count of the counting identifier is over the maximum value ("Yes" in S17), the counting identifier is set to "1" (S18). The corresponding component information is supplied based on the component identifier obtained in the step S15 from a component library 32 as the component library section (S19). According to the obtained component information, an adsorbing device is selected from a plurality of adsorbing devices (S20). Based on the component feeder information, a movable head is moved to adsorb the component (S21). After a posture or the like of the component is detected by use of the recognition device based on the component information (S22), the head is moved to the obtained X-Y coordinate to mount the component on the printed wiring board (S23).

For example, when the step No. 3 is obtained, the component feeder No. as the component feeder identifier is "Z2".

Since the counting identifier of the component feeder Z2 is "1", the component identifier "P01" is obtained based on the counting identifier "1" of Z2 from the component feeder database. The counting identifier of Z2 is changed to "2" in the step S16. Then, when the step No. 4 is obtained from the NC information database, the component feeder No. is Z2 and the counter of Z2 is "2". Therefore, the component identifier "P02" is obtained based on the counter "2" of Z2 from the component feeder database. Similarly, when the step No. 6 is obtained, the counting identifier of Z2 is "4" in the step S16. Since the counting identifier is over the maximum value of the count of Z2, the counting identifier of Z2 is set to "1" (S18). Thereby, Z2 of the component feeder database repeats periodically the component identifiers of the components of each mounting unit of the printed wiring board.

Since the printed wiring board in a process for mounting the components has on the same board repeated units in each of which the components are disposed in series in some cases, repeated mounting units of Z2 may correspond to the repeated units on the same board.

At this time, the process of the first step is finished and the process returns to the step S12. After the process proceeds to a next step No. in the step S12, if the process is not finished ("No" in S13), the process proceeds to the step S14, and if the process is finished ("Yes" in S13), the process is completed.

Since the mounting apparatus is controlled as described above, the component information in the component library 32 can be selected even when the component is not on a one-to-one relationship with the component feeder, so that components of plural types can be mounted on the printed wiring board by one component feeder.

The mounting apparatus according to a third embodiment of the present invention will be explained. If errors occur when the component is adsorbed from the component feeder or the component is recognized, generally, the component is adsorbed from the component feeder once again and mounted on the printed wiring board. However, in the component feeder in which the components of plural types are disposed, it is impossible for the required component to be adsorbed again, since the mounting order corresponds to the order of the components disposed on the component feeder. Therefore, in the mounting apparatus according to the third embodiment of the present invention, when a mounting error occurs, error information is stored and a list of non-mounted components for each board is outputted. Thereby, only the non-mounted components can be mounted based on the information or the list after the mounting process is finished. The output list may include, for example, information to allow the non-mounted component to be identified, such as the addresses, the X-Y coordinate of the printed wiring board.

FIGS. 5A and 5B show a structure of a taping member used in the mounting apparatus according to an embodiment of the present invention. In FIG. 5A, an illustration of a cover tape is omitted.

The taping member 21 shown in FIG. 5A includes a carrier tape 22, and a cover tape 23 which covers the carrier tape 22. The carrier tape 22 is provided with recesses 24a, 24b, 24c capable of placing electronic components 50a, 50b, 50c of plural types, respectively, which are to be mounted on a printed wiring board. The recesses 24a, 24b, 24c have different shapes corresponding to the placed electronic components 50a, 50b, 50c, respectively.

The above taping member 21 is used in a state in which the taping member 21 is set in a chip feeder which is set to a mounting device to mount the electronic components on the printed wiring board. Therefore, the taping member 21 is configured to be reeled in a reel state. That is to say, the carrier tape 22 is configured to be reeled off with the cover tape 23.

FIGS. 6A and 6B show another structure of the taping member used in the mounting apparatus according to an embodiment of the present invention. In FIG. 6A, an illustration of a cover tape is omitted. The same reference numbers are used for the same structures as those of FIGS. 5A and 5B, and detailed explanations are omitted.

In the taping member 21 shown in FIG. 6A, recesses 24a, 24c are disposed at different intervals along a longitudinal direction of the taping member, while the recesses 24a, 24b, 24c shown in FIG. 5A are disposed at regular intervals. The plural components are formed in a group and the groups are disposed at regular intervals. In this case, an interval X between the two recesses is set so as to correspond to a feed length of the component, which is placed in one of the two recesses and larger than the other. For example, if the abutting electronic components are 50a and 50c, the interval between recesses 24a and 24c is set so as to correspond to a feed length of the electronic component 50c.

If the electronic components abutting each other are the same components 50a, 50a, the interval between the recesses 24a, 24a is set to X1. In this case, the width Y of the carrier tape 22 is set so as to be matched to the electronic component having a largest size of the components 50a to 50c placed in the recesses 24a to 24c. Two electronic components 50a, 50c form a group and the groups are placed repeatedly on the carrier tape 22. A reference mark 25 indicating a reference position is provided on each group. In the above taping member 21, the electronic components of plural types 50a to 50c which have various feed lengths can be placed on the one carrier tape 22, so that the number of used taping members can be reduced in a mounting device. Due to the above structures, the number of component types which can be mounted by one mounting device can be increased, so that productivity of the mounting device can be easily improved.

Conventionally, since a feed length of each component is specified to the component type, a feed length value is recorded in the component library. However, since the carrier tape in which different types of components are placed is fed with corresponding feed lengths depending on the component types as shown in FIG. 6, the components do not have a one-to-one relationship with the feed lengths. In this case, since the feed length value is not required to be recorded in the component library, the feed length value is recorded in the component feeder database 31 as shown in FIG. 4 so that the one carrier tape can be fed with different feed lengths depending on the component types.

Due to the above structures, the number of electronic component types which can be mounted by one mounting device can be further increased, so that productivity of the mounting device can be easily improved.

The reference marks will be explained with reference to FIG. 7.

FIGS. 7A to 7D show examples of structures of the reference marks. FIGS. 7A, 7B, 7C, and 7D show reference marks in a shape of a hole 25a, a slit 25b, a printed mark 25c, and a bar-code 25d.

Figure 7A:
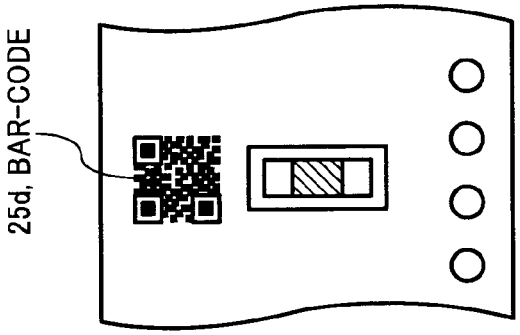
FIGS. 7A to 7D are views showing examples of reference marks.
Figure 7B:
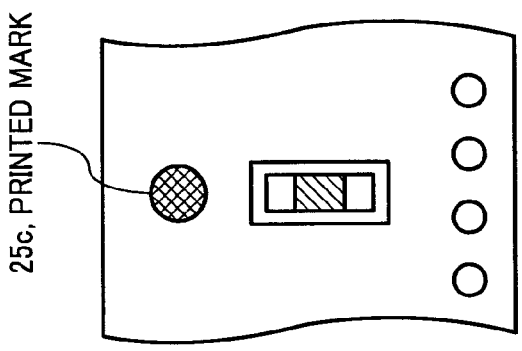
Figure 7C:
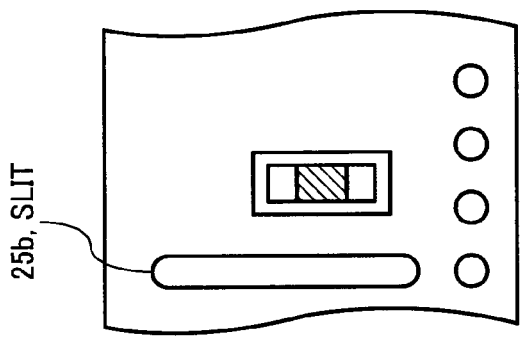
Figure 7D:
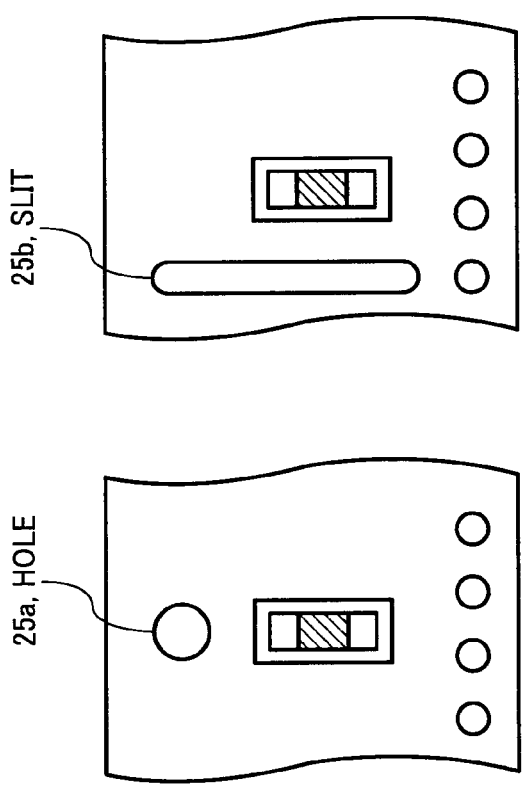

In a case where the reference mark is formed in a shape of the bar-code shown in FIG. 7D, information such as the number of components, feed length value, or component information (outer shape L (length), width W, height T), embossed depth, component library No., adsorbing nozzle No., or the like may be recorded by use of the bar-code 25d.

The component information may be recorded by use of a magnetic tape, an IC tag, or the like.

Due to the above structures, even when electronic components of plural types are placed on one taping member 21, a position of the electronic component can be easily obtained and failures of mounting can be steadily prevented.

Figure 8:
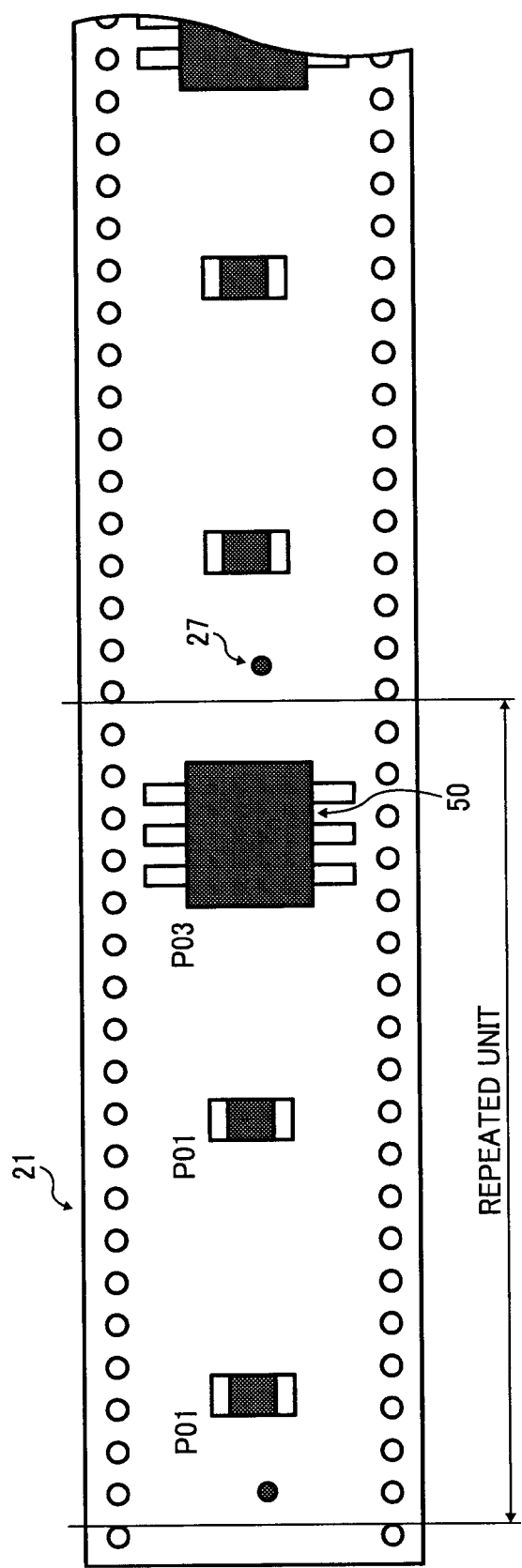
FIG. 8 is a view showing a carrier tape which is set to a component feeder and in which a plurality of components are disposed.
Figure 9A:
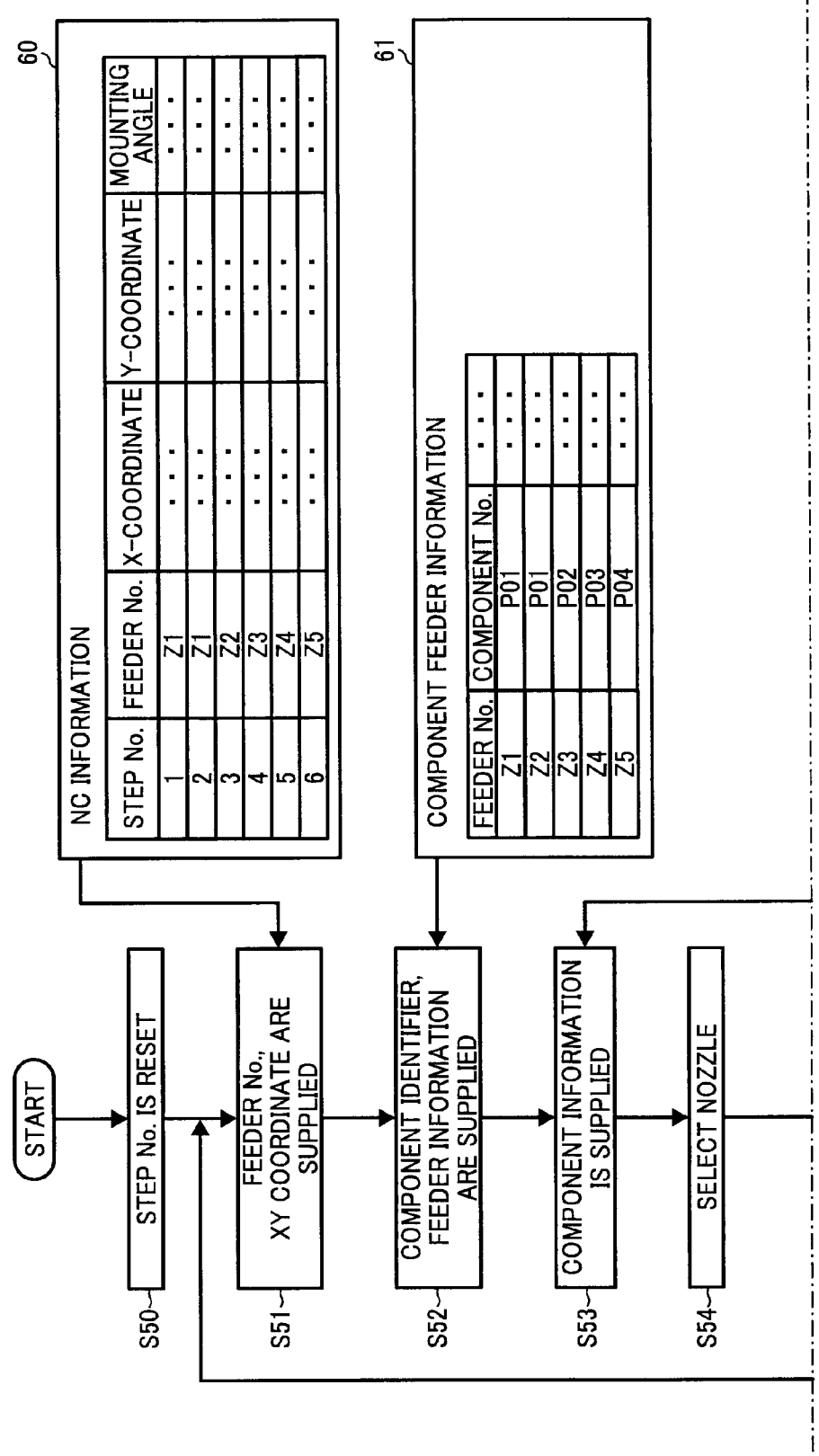
FIG. 9 is a flowchart showing a control process of a conventional mounting apparatus.
Figure 9B:
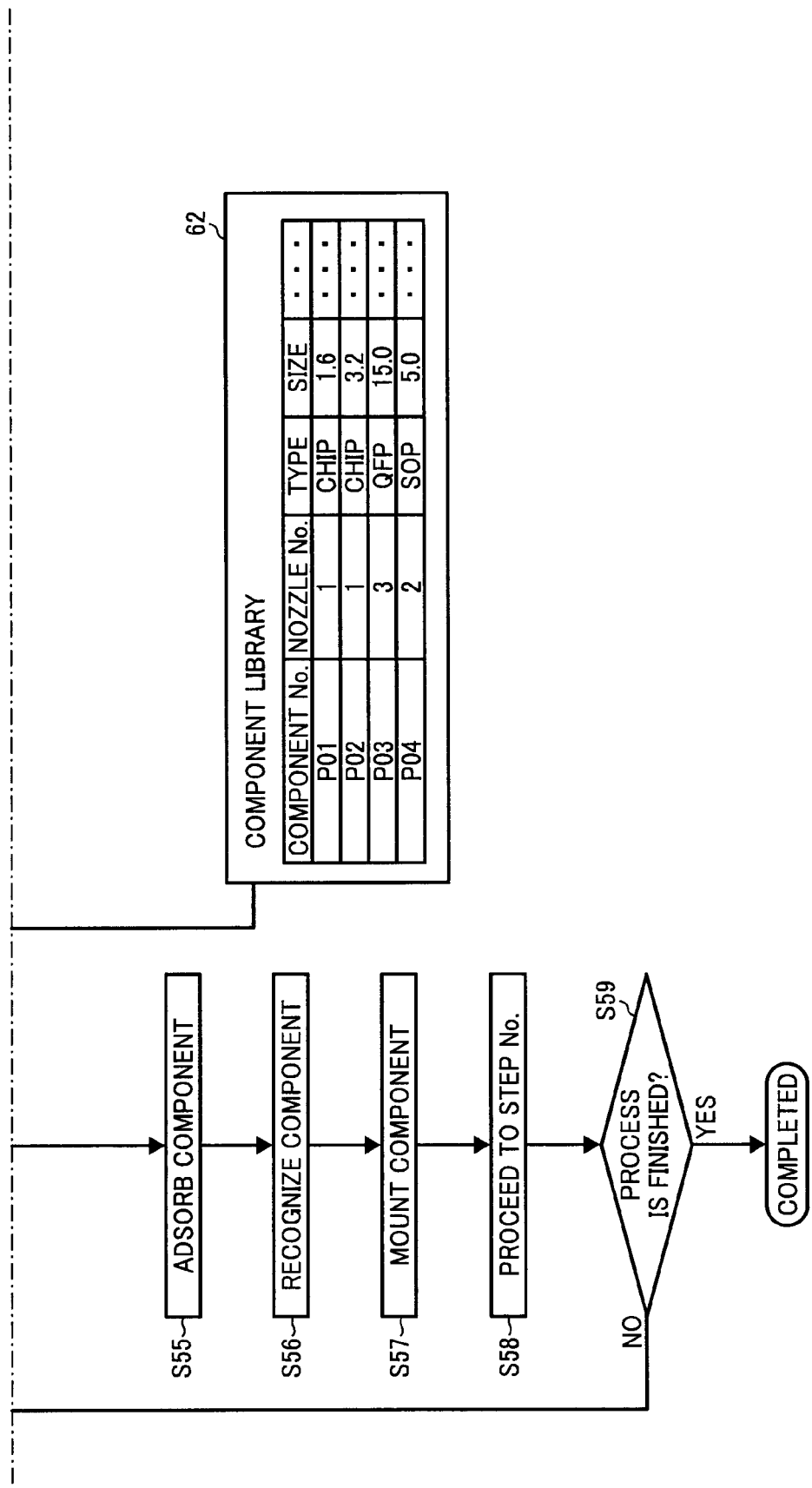

FIG. 8 shows a carrier tape in which plural components are placed. The carrier tape is set to the component feeder of the mounting apparatus to dispose the plural components on the component feeder. As shown in FIG. 8, the plural components are disposed in a group to be used in each printed wiring board and the groups are repeatedly disposed.

In a case of the above carrier tape, if a starting position of each group is missed, incorrect components are adsorbed so that the components can not be mounted on the printed wiring board. In a case where the reference mark 27 shown in FIG. 8 is provided on the carrier tape 21 and the reference mark 27 is detected by the mounting apparatus, reference positions of the repeated groups can be set to the starting position of the repeated groups in each printed board. The mounting apparatus may include a device specified to detect the reference mark, or use a preliminarily provided camera for recognition of the printed wiring board.

In addition, structural components, types, combinations, shapes, relative configurations, or the like described in the embodiments are examples to illustrate the present invention, and are not limited to the above described embodiments.

According to an embodiment of the present invention, since at least one carrier tape on which electronic components of different types are disposed and the electronic components are mounted on a board by identifying the component library according to a mounting order, changes of the chip feeder or the carrier tape due to there being no components are minimized to improve the production ratio.

In the mounting apparatus according to an embodiment of the present invention, at least one component feeder on which the electronic components of different types are disposed in series, the components forming groups in each of which plural components are disposed in same order, is provided. The component feeder information section sets sequentially a counting identifier of each electronic component which is disposed in the group and the component library is identified. Since the electronic components of different types are mounted by use of only one component feeder, component types of the electronic components which can be mounted by one mounting device can be easily increased so that productivity of the mounting device can be easily improved.

According to an embodiment of the present invention, at least one component feeder on which the components of different types are disposed in series is provided, and the components form groups having some components of different types disposed in the same order, the groups being repeatedly disposed. The component feeder information section sets sequentially a counting identifier and a feed length value of each component, which is disposed in each group, and the component library is identified based on the counting identifier. The feed length is set based on the feed length value of each component recorded in the component feeder information section so that the number of component types which can be mounted on the printed wiring board by one mounting device can be further increased and productivity of the mounting device can be easily improved.

Although the preferred embodiments of the present invention have been described, it should be noted that the present invention is not limited to these embodiments, and various changes and modifications can be made to the embodiments.

What is claimed is:

1. A mounting apparatus configured to mount electronic components on a board, comprising:
a plurality of component feeders each having a separate carrier tape on which the electronic components are disposed in a row;
a mounting information supplier configured to supply mounting information including a component feeder identifier of each of the plurality of component feeders and a component identifier of each of the electronic components; and
a mounting device configured to mount the electronic components on the board based on the mounting information provided from the mounting information supplier,
wherein the electronic components disposed in a row on a single carrier tape of at least one of the plurality of component feeders have different characteristics;
wherein the component feeder identifier of the at least one of the plurality of component feeders corresponds to the component identifiers of the electronic components having the different characteristics disposed on the corresponding component feeder;
wherein the electronic component to be mounted and the component feeder on which the electronic component to be mounted is disposed are identified by the component identifier and the component feeder identifier each time one of the electronic components is to be mounted.

2. The mounting apparatus according to claim 1,
wherein the mounting information supplier includes:
an NC information section to supply the component feeder identifier of the at least one of the plurality of component feeders in each step of mounting components;
a component feeder information section configured to supply feeder information with respect to each component feeder identifier; and
a component library section configured to obtain the component identifier of the component to be fed in the mounting step from the NC information section or the component feeder information section and to supply component information with respect to each component identifier,
wherein the component feeder is configured to mount the components by identifying the component information of the component library section in order of the mounting steps.

3. The mounting apparatus according to claim 2,
wherein the NC information section is configured to supply a position in an X-Y coordinate on the board, the component being to be mounted at the position on the board in each mounting step; and
wherein the component is mounted on the board based on the X-Y coordinate from the NC information section.

4. The mounting apparatus according to claim 2, wherein the component data includes at least a nozzle number, a component type, and a component size of each component.

5. The mounting apparatus according to claim 2, wherein
the components of different types disposed in series form groups in each of which components of different types are disposed in series in the same order;
a counting identifier of each component in the component feeder corresponding to the component feeder identifier supplied from the NC information section is sequentially set in the component feeder information section;
the component identifier is supplied based on the component feeder identifier and the counting identifier; and
the component feeder is configured to mount the component on the board by identifying the component information of the component library based on the component identifier in order of the mounting steps.

6. The mounting apparatus according to claim 5, wherein
the counting identifier and a feed length value of each component disposed in the group are sequentially set in the component feeder information section;
the component information of the component corresponding to the component identifier is identified; and
a feed length of each component disposed in the group is set based on the feed length value.

7. The mounting apparatus according to claim 5, wherein
the counting identifier of each component disposed in the group is sequentially set in the component feeder information section; and
the component feeder is configured to mount the components on the board by identifying the component information in order of the mounting steps obtained from the NC information section.

8. The mounting apparatus according to claim 5, wherein
the counting identifier and a feed length value of each component disposed in the group are sequentially set in the component feeder information section;
the component information of the component library section is identified with respect to the component identifier; and
the component feeder is configured to mount the components on the board by setting a feed length based on the feed length value.

* * * * *